United States Patent [19]
Lin

[11] Patent Number: 6,127,223
[45] Date of Patent: Oct. 3, 2000

[54] METHOD OF FABRICATING A FLASH MEMORY CELL

[75] Inventor: Chih-Hung Lin, Hsinchu, Taiwan

[73] Assignee: United Semiconductor Corp., Hsinchu, Taiwan

[21] Appl. No.: 09/186,743

[22] Filed: Nov. 5, 1998

[30] Foreign Application Priority Data

Jul. 30, 1998 [TW] Taiwan ................................. 87112532

[51] Int. Cl.⁷ .............................................. H01L 21/8247
[52] U.S. Cl. ........................................ 438/257; 438/264
[58] Field of Search .................... 438/257–267, 438/593–594

[56] References Cited

U.S. PATENT DOCUMENTS

| 5,646,059 | 7/1997 | Sheu et al. . | |
|---|---|---|---|
| 5,770,501 | 6/1998 | Hong | 438/264 |
| 6,033,956 | 3/2000 | Wu | 438/261 |

Primary Examiner—Richard Booth
Attorney, Agent, or Firm—J.C. Patents; Jiawei Huang

[57] ABSTRACT

The present invention provides a method of fabricating a flash memory cell without silicide formation on the source regions. A liquid deposition oxide layer is formed selectively only on a common source region by using a mask layer. The liquid deposition oxide layer is formed on the common source region in order to cover the common source region. Therefore, once a salicide step is performed, a silicide layer will not form on the common source region.

20 Claims, 11 Drawing Sheets

(I)

(II)

(III)

(I)

(II)

(III)

(I)

(II)

(III)

(I)

(II)

(III)

(I)

(II)

(III)

(I)

(II)

(III)

(I)

(II)

(III)

(I)

(II)

(III)

(I)

(II)

(III)

(I)

(II)

(III)

METHOD OF FABRICATING A FLASH MEMORY CELL

CROSS-REFERENCE TO RELATED APPLICATION

This application claims the priority benefit of Taiwan application Ser. No. 87112532, filed Jul. 30, 1998, the full disclosure of which is incorporated herein by reference.

BACKGROUND OF THE INVENTION

1. Field of Invention

The present invention relates to a semiconductor fabricating method. More particularly, the present invention relates to a method of forming an erasable programmable read only memory.

2. Description of Related Art

EPROM, an acronym for Erasable Programmable Read Only Memory, is the memory circuit that is most often used in computer and electronic products. One of its advantages is that neither the program, nor the data stored in the EPROM, will not be lost under normal conditions. If there is a need to erase the stored program and data, it is simply exposed to an ultraviolet light source for a specified period of time. In this way, the EPROM can be reprogrammed again. However, the EPROM erase operation will wipe out all the stored data residing within. Therefore, whenever data update is required, every bit of data must be rewritten back to the EPROM, which is rather time consuming. Intel Corporation developed flash EPROM technology. In flash EPROM, the data does not need to be completely erased. Instead, the characteristic of the flash EPROM is to erase data block by block. Hence, the time for reprogramming a flash EPROM is reduced.

An Intel type flash EPROM cell is incorporated within the EPROM. The erasing step is performed in the source regions of the flash memory cell. In the conventional method of fabricating a flash memory cell, it is easy to form silicide layers on the source regions. The silicide formations on source regions will cause current leakage and reduce the endurance of components.

FIG. 1 is a top-view of a layout showing a conventional flash memory cell. In FIG. 1, the conventional flash memory cell includes a field oxidation 101, a floating gate layer 103, a control gate 105, a mask layer 106, a drain region 109, and a common source region 108. The mask layer 106 is used for a self-align source (SAS) etching step.

FIGS. 2A through 2E are cross-sectional views of a portion of a semiconductor device showing the conventional steps of fabricating a flash memory cell. The (I) of each figure is a cross-sectional view of FIG. 1 taken along line I—I. The (II) of each figure is a cross-sectional view of FIG. 1 taken along line II—II. The (III) of each figure is a cross-sectional view of FIG. 1 taken along line III—III.

In FIG. 2A, a P-type substrate 100 having a field oxidation 101 thereon is provided. A tunnel oxide layer 102 and a floating gate layer 103 are formed sequentially over the substrate 100, in which tunnel oxide layer 102 and the floating gate layer 103 are patterned.

In FIG. 2B, an isolation layer 104 and a control gate layer 105 are formed sequentially over the substrate 100. The control gate layer 105, the isolation layer 104, the floating gate layer 103, and the tunnel oxide layer 102 are patterned.

In FIG. 2C, a mask layer 106 is formed over the substrate 100. The mask layer 106 is used for defining a common source region (See FIG. 2D). The mask layer 106 is used as an etching mask in order to etch a portion of the field oxidation 101, which is exposed by the mask layer 106 thereon. Once the etching step is completed, the field oxidation 101, which is exposed by the mask layer 106 thereon, is removed to expose a portion of the substrate 100. The etching step described above is called a self-align source (SAS) etching step. A source-lightly-doped ion implantation is performed to form an n-doped layer 103 in the substrate 100.

In FIG. 2D, the mask layer 106 is removed. A source-drain ion implantation is performed to form a common source region 108 and a drain region 109 in the substrate 100.

In FIG. 2E, spacers 110 are formed on sidewalls of the control gate layer 105, the isolation layer 104, the floating gate layer 103, and the tunnel oxide layer 102. A salicide step is performed to form silicide layers 111 on the control gate layer 105, the common source region 108, and the drain region 107.

In the conventional method of fabricating a flash memory cell, the silicide layers 111 are formed on a source region, such as the common source regions 108 (shown in FIG. 2E). As is known, the erasing step is performed on the source region. Once the erasing step is performed, the silicide formation on source region causes leakage current. Thus, it reduces the endurance of components.

SUMMARY OF THE INVENTION

Accordingly, the present invention provides a method of fabricating a flash erasable programmable read only memory. In the present invention, there is no silicide formation on the source regions. A liquid deposition oxide layer is selectively formed only on a common source region by using a mask layer. The liquid deposition oxide layer is formed on the common source region in order to cover the common source region. Therefore, once a salicide step is performed, a silicide layer does not form on the common source region.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
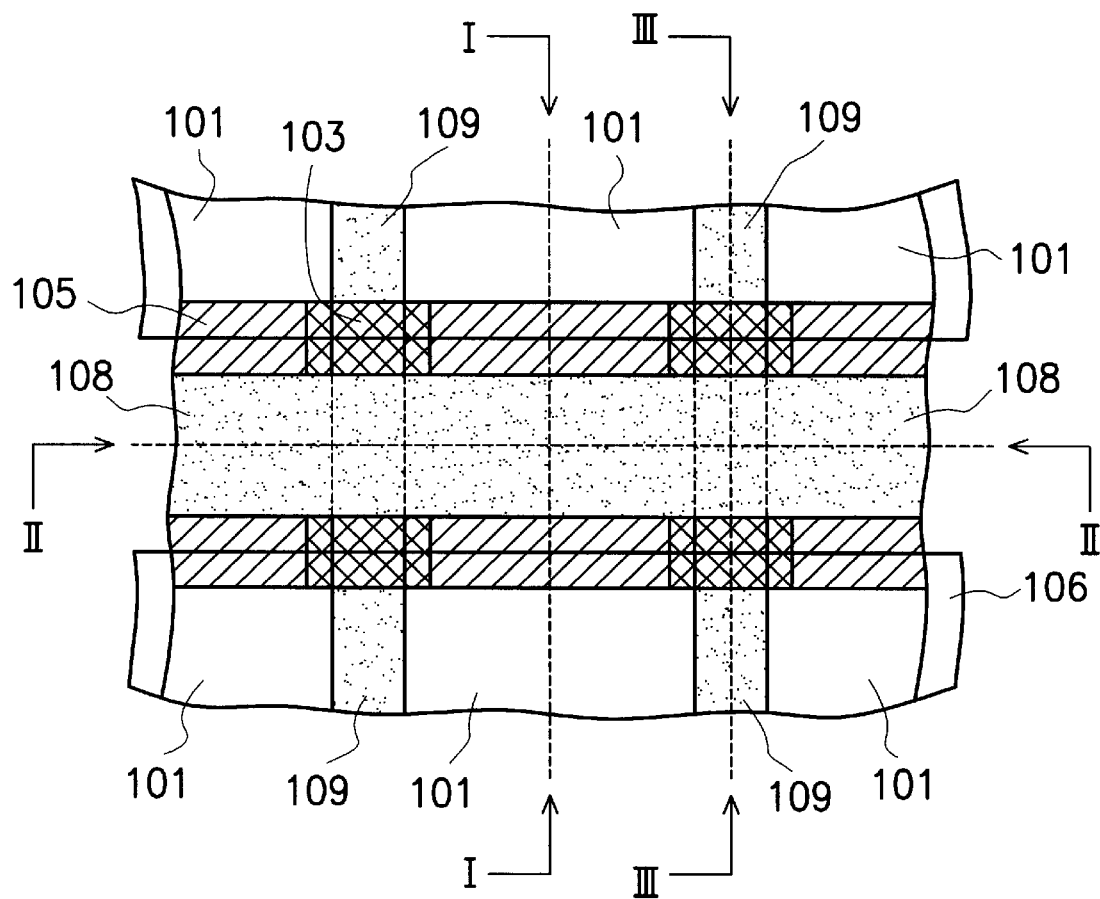
FIG. 1 is a top view layout showing a conventional flash memory cell.
Figure 2A:
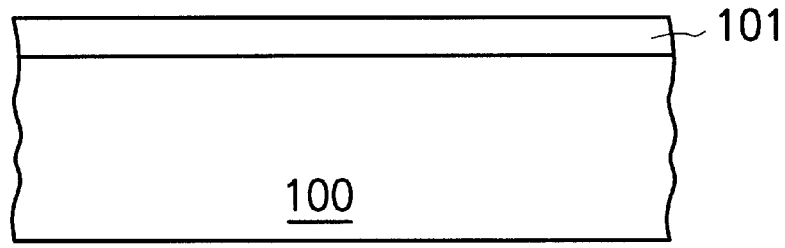
FIGS. 2A through 2E are cross-sectional views of a portion of a semiconductor device showing the conventional steps of fabricating a flash memory cell. The (I) of each figure is a cross-sectional view of FIG. 1 along line I—I. The (II) of each figure is a cross-sectional view of FIG. 1 along line II—II. The (III) of each figure is a cross-sectional view of FIG. 1 along line III—III.
Figure 2A:
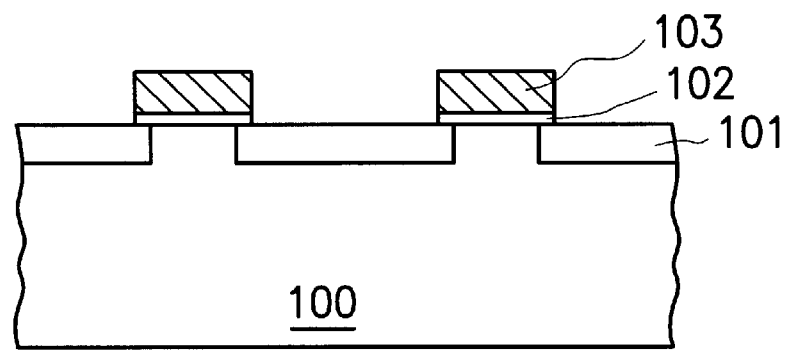
Figure 2A:
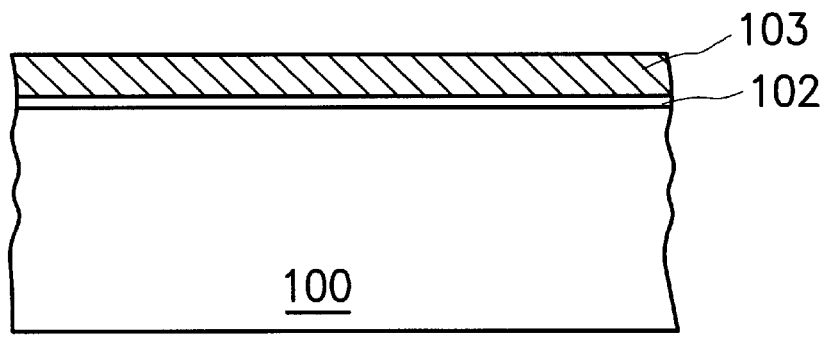
Figure 2B:
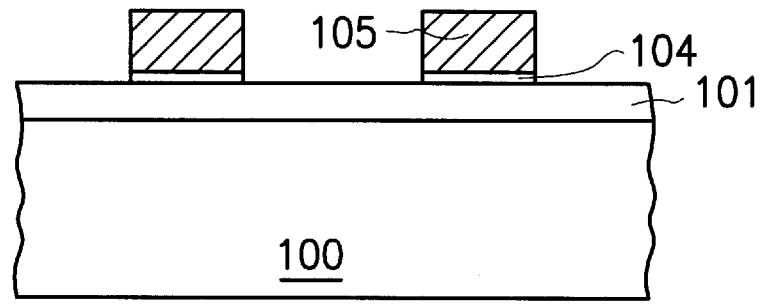
Figure 2B:
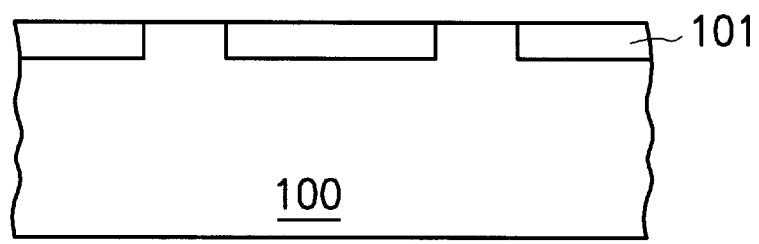
Figure 2B:
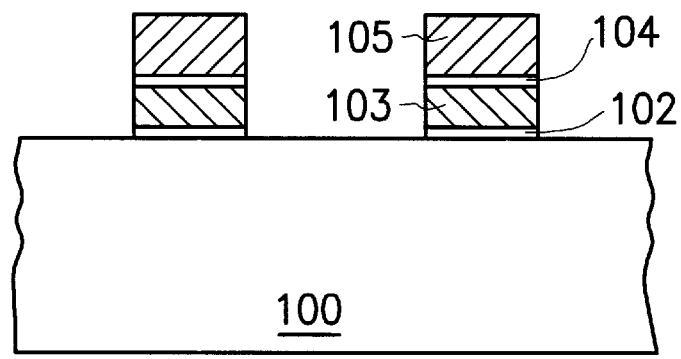
Figure 2C:
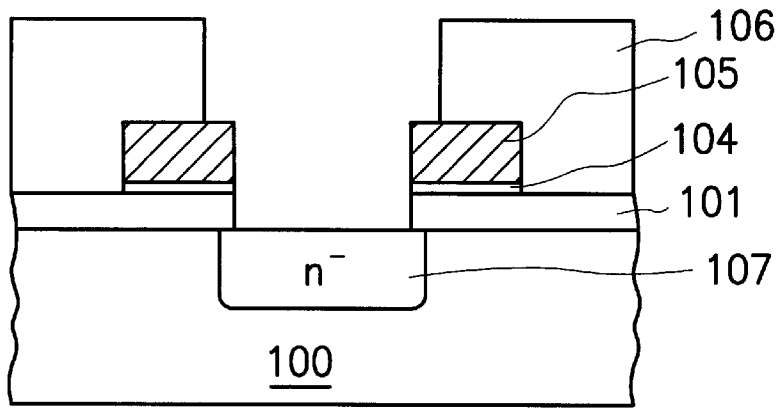
Figure 2C:
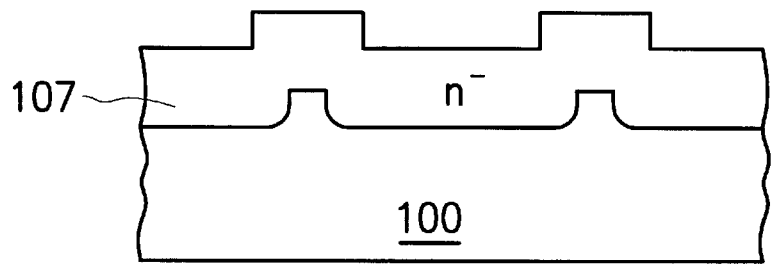
Figure 2C:
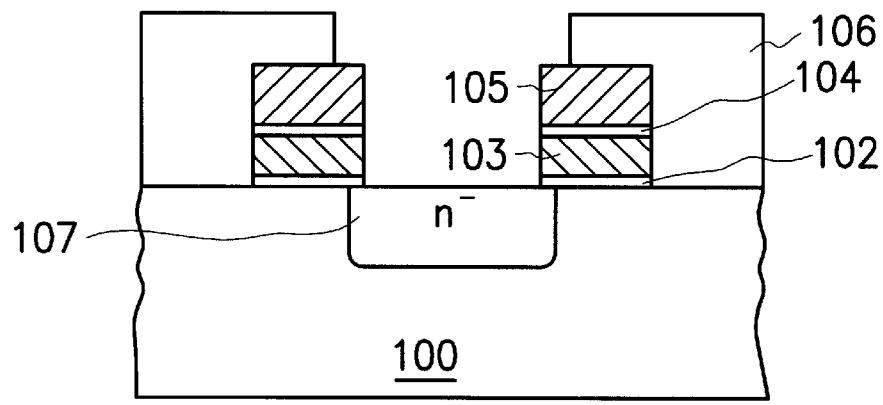
Figure 2D:
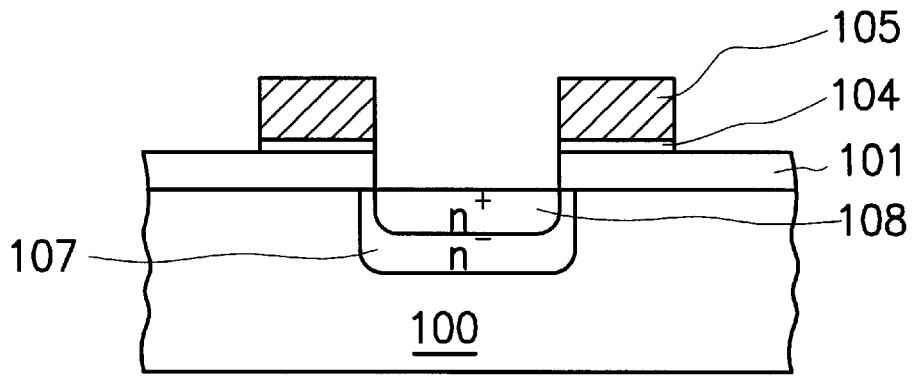
Figure 2D:
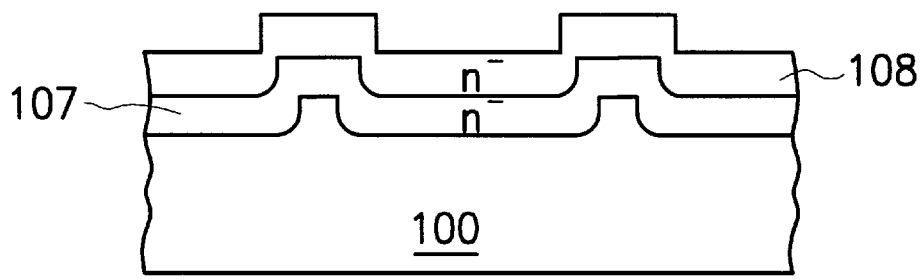
Figure 2D:
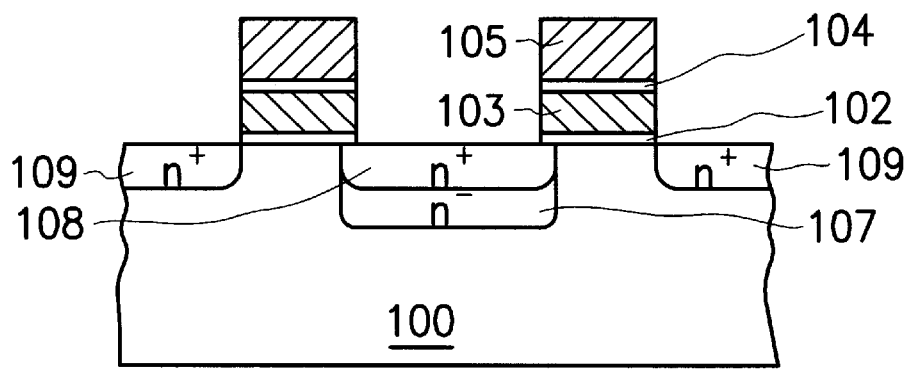
Figure 2E:
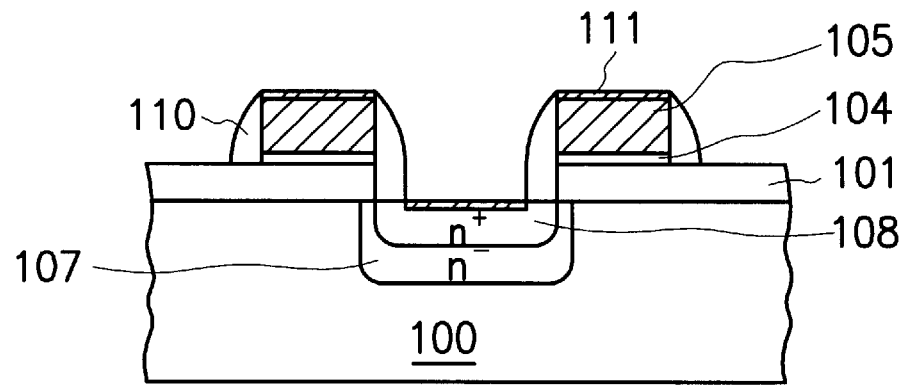
Figure 2E:
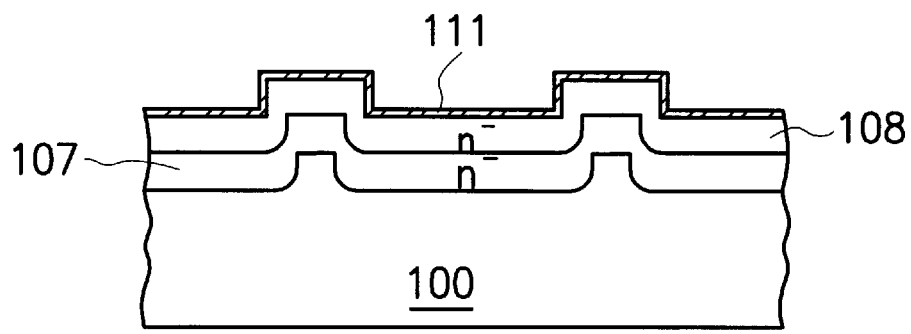
Figure 2E:
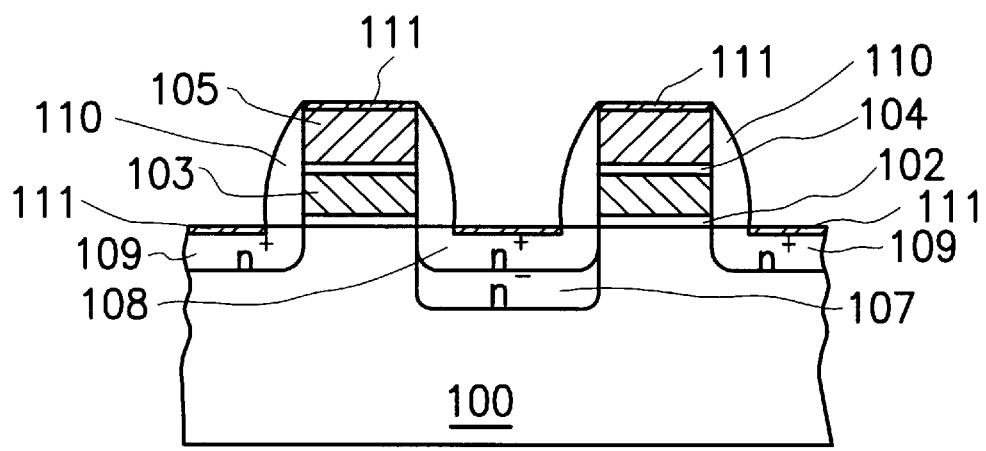

Reference will now be made in detail to the present preferred embodiments of the invention, examples of which are illustrated in the accompanying drawings. Wherever possible, the same reference numbers are used in the drawings and the description to refer to the same or like parts.

The present invention provides an improved method of fabricating a flash memory cell. With this improved method, the silicide layers are not formed on the source regions or the common source regions.

FIGS. 3A through 3D are cross-sectional views of a portion of a semiconductor device showing the steps of fabricating a flash memory cell according to one preferred embodiment of this invention. The (I) of each figure is a cross-sectional view of FIG. 1 taken along line I—I. The (II) of each figure is a cross-sectional view of FIG. 1 taken along line II—II. The (III) of each figure is a cross sectional view of FIG. 1 taken along line III—III.

Figure 3A:
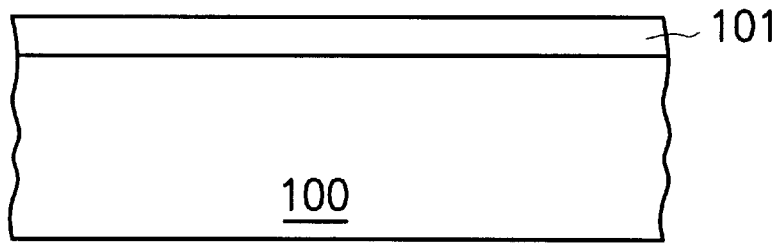
FIGS. 3A through 3E are cross-sectional views of a portion of a semiconductor device showing the fabricating steps of a flash memory cell according to one preferred embodiment of the invention. The (I) of each figure is a cross-sectional view of FIG. 1 along line I—I. The (II) of each figure is a cross-sectional view of FIG. 1 along line II—II. The (III) of each figure is a cross-sectional-view of FIG. 1 alone line III—III.
Figure 3A:
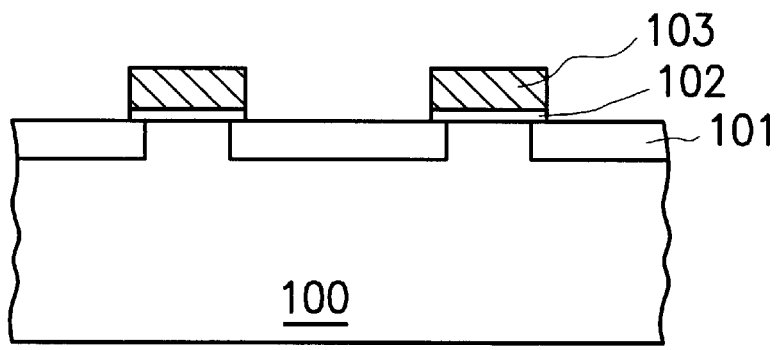
Figure 3A:
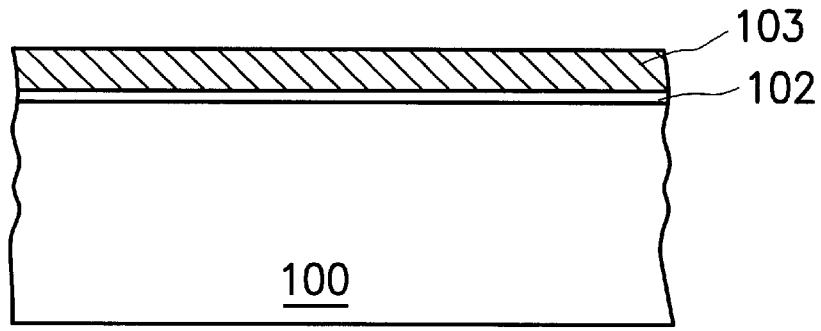

In FIG. 3A, a substrate 100 having an isolation structure 101 therein is provided. The isolation structure 101 can be a field oxidation or a shallow trench isolation, for example, and is used to insulate active regions of the substrate 100. The substrate 100, for example, can be a P-well or a P-type silicon substrate. A tunnel oxide layer 102 and a floating gate layer 103 are formed sequentially over the substrate 100. The tunnel oxide layer 102 and the floating gate layer 103 are patterned. For example, the tunnel oxide layer 102 and the floating gate layer are patterned with a mask by using a dry etching method. The floating gate layer 103 can be a polysilicon layer or a doped polysilicon layer, for example. The step described above of patterning the tunnel oxide layer 102 and the floating gate layer 103 can be selectively performed by only patterning the floating gate layer 103.

Figure 3B:
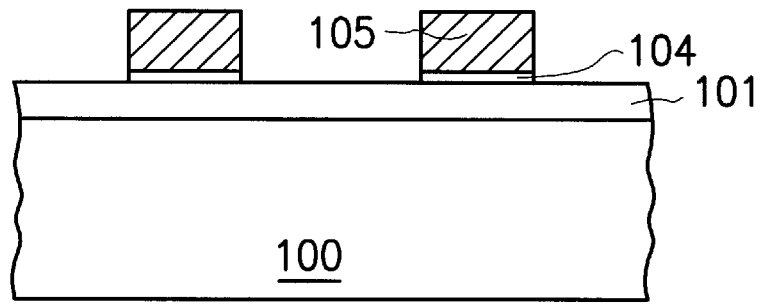
Figure 3B:
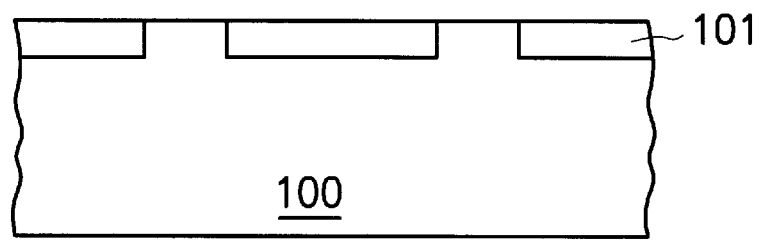
Figure 3B:
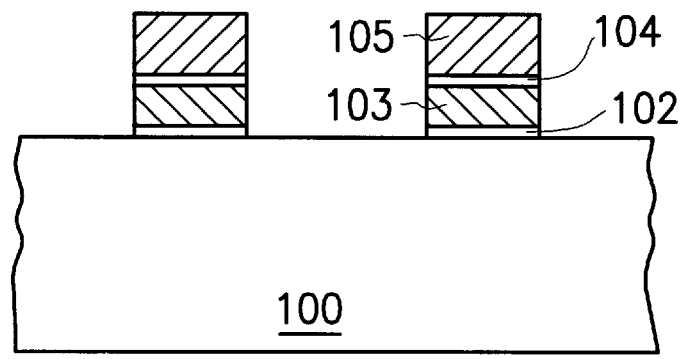

In FIG. 3B, a first isolation layer 104 and a control gate layer 105 are formed sequentially over the substrate 100. The control gate layer 105, the first isolation layer 104, the floating gate layer 103, and the tunnel oxide layer 102 are patterned. For example, the control gate layer 105, the first isolation layer 104, the floating gate layer 103, and tunnel oxide layer 102 are patterned with a mask by using a dry etching step. The step shown above of patterning the layers can selectively omit the step of patterning the tunnel oxide layer 102. The first isolation layer 104 can be, for example, an oxide/nitride/oxide (ONO) layer. The control gate layer 105 can be, for example, a polysilicon layer or a doped polysilicon layer.

Figure 3C:
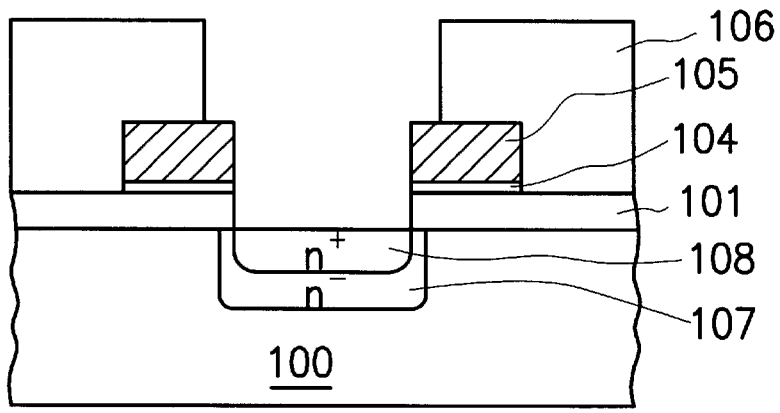
Figure 3C:
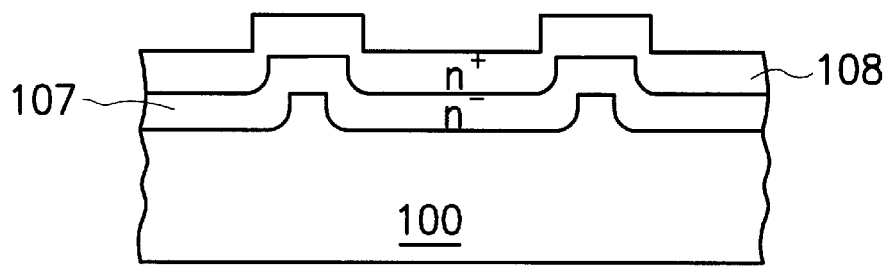
Figure 3C:
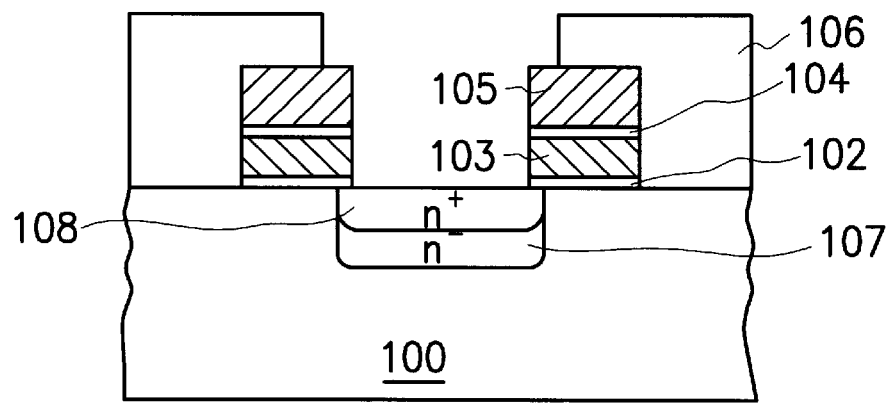

In FIG. 3C, a mask layer 106, such as a photoresistor layer, is formed over the substrate 100. The mask layer 106 is used as an etching mask in order to etch a portion of the isolation structure 101, which is exposed by the mask layer 106 thereon. Once the etching step is completed, the isolation structure 101, which is exposed by the mask layer 106 thereon, is removed to expose a portion of the substrate 101. The above step is a SAS etching step. Then a source-lightly-doped ion implantation is performed to form a source-lightly-doped region 107 in the substrate 100. The source-lightly-doped region 107, for example, can be an n-doped region. A source ion implantation is performed to form a common source region 108, such as an N$^+$-doped region, over the source-lightly-doped region 107.

Figure 3D:
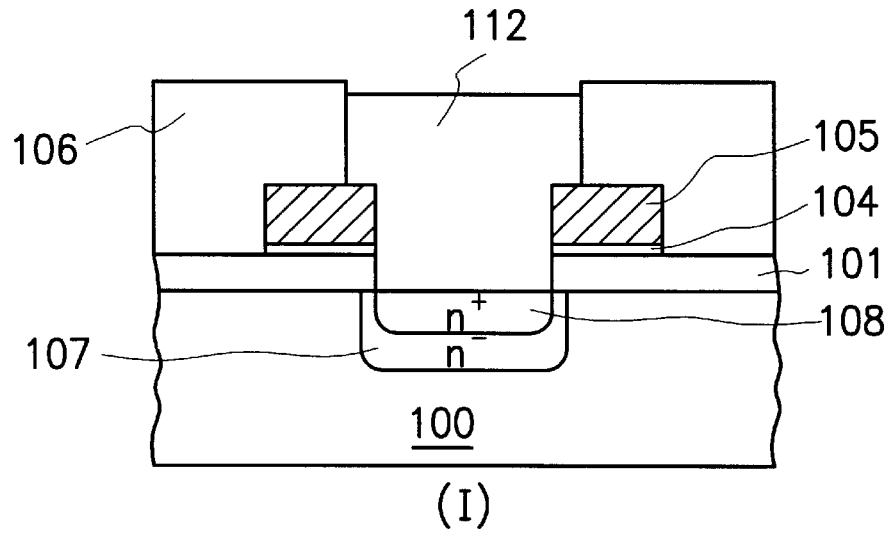
Figure 3D:
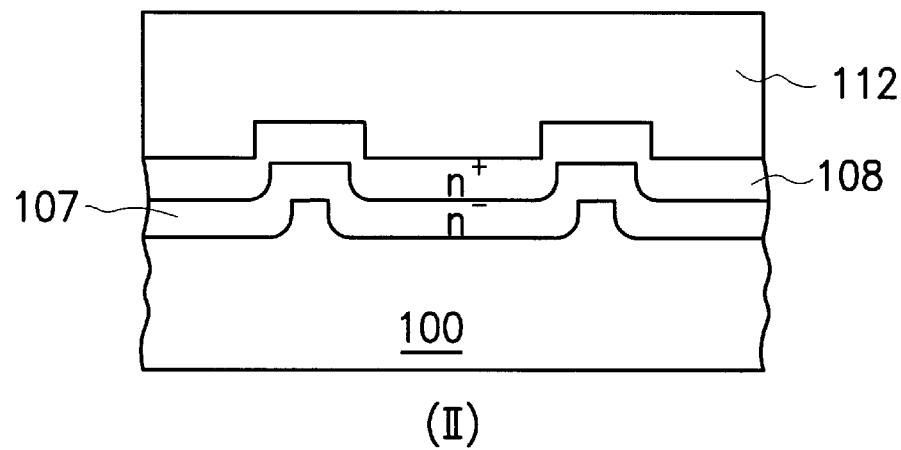
Figure 3D:
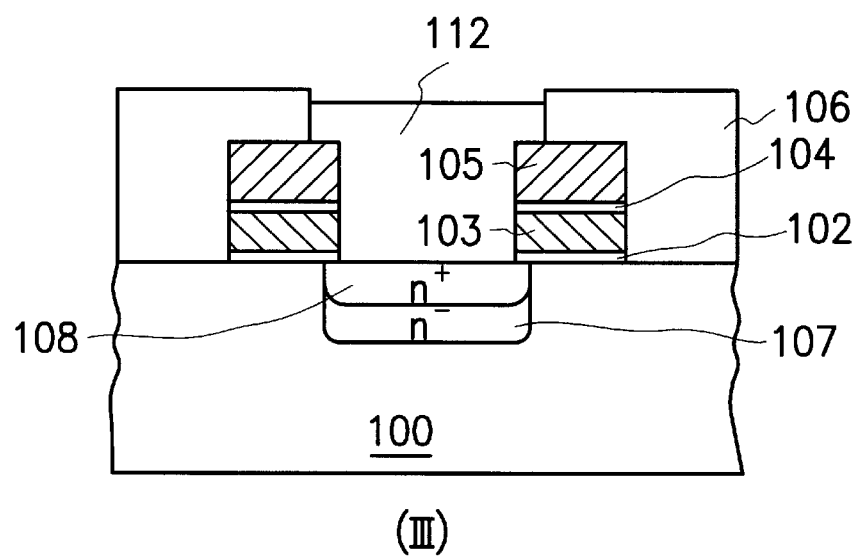

In FIG. 3D, a liquid-phase deposition is performed to form a liquid-phase deposition oxide layer 112 over the substrate 100, which is exposed by the mask layer 106 thereon. Because of the selectivity of the liquid-phase deposition, the liquid-phase-deposition oxide layer 112 is not formed over the mask layer 106. The liquid-phase-deposition oxide layer 112 is formed to cover the common source region 108. Thus, it avoids the silicide layers (shown in 3E) formed on the common source region 108 in the following step.

Figure 3E:
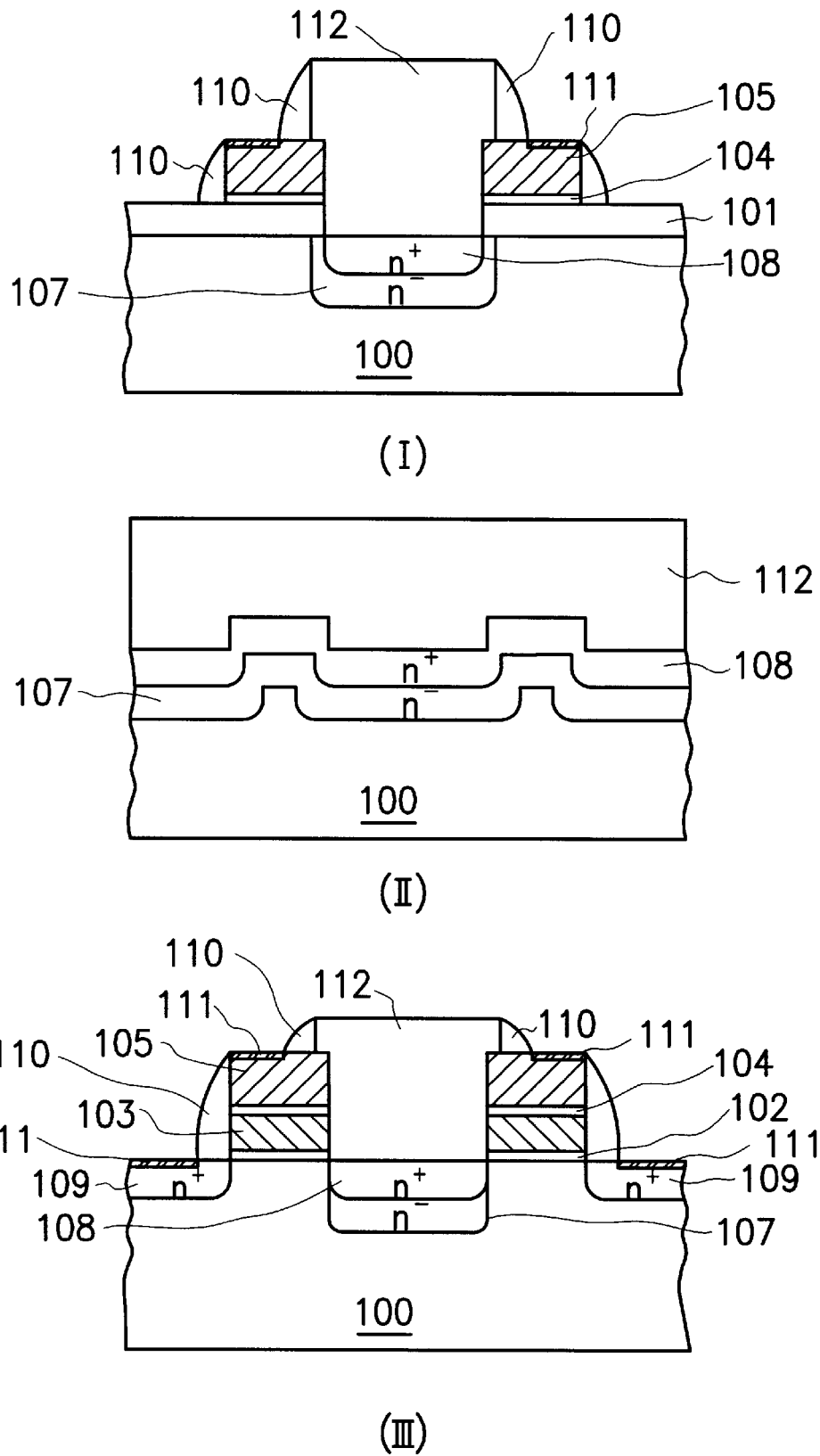

In FIG. 3E, the mask layer 106 is removed. A drain ion implantation is provided to form a drain region 109 in the substrate 100. Spacers 110 are formed on sidewalls of the control gate layer 105, the isolation layer 104, the floating gate layer 103, and the tunnel oxide layer 102. The spacers 110 can be an oxide layer or a silicon nitride layer, for example. A salicide step is performed to form silicide layers 111, such as TiSi$_2$ or CoSi$_2$, over the control gate layer 105 and the drain region 109. The common source region 108 is covered by liquid-phase deposition oxide 112. Therefore, there is no silicide layer 111 formed over the common source region 108.

In summary, the present invention provides the liquid-phase-deposition oxide layer 112 formed on the common source region 108. Therefore, it prevents silicide layers 111 from being formed on the common source region 108 (shown in FIG. 3E). In the present invention, there is no silicide layer formed on the source region. Thus, the leakage current does not occur when the erasing step is performed and the endurance of the components is increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An improved method of fabricating a flash memory cell, wherein the method comprises:

providing a substrate having an isolation structure thereon to insulate an active region;

sequentially forming a tunnel oxide layer and a patterned floating gate layer over the substrate;

sequentially forming a first isolation layer and a control gate layer and patterning the control gate layer, the first isolation layer, and the floating gate layer;

forming a mask layer over the substrate in order to define a common source region and etching a portion of the isolation layer, which is exposed by the mask layer thereon;

performing a source lightly doped ion implantation to form a source-lightly-doped region in the substrate;

performing a source doped ion implantation to form a common source region over the source lightly doped region;

performing a liquid-phase deposition to form a liquid-phase-deposition oxide layer over the substrate, which is exposed by the mask layer thereon, wherein the liquid-phase-deposition oxide layer covers the common source region;

removing the mask layer;

performing a drain ion implantation to form a drain region in the substrate;

forming spacers on the control gate layer, the first isolation layer, the floating gate layer, and the tunnel oxide layer; and performing a silicide step to form silicide layers on the control gate layer and the drain region.

2. The method of claim 1, wherein the substrate includes a P-type silicon substrate.

3. The method of claim 1, wherein the substrate includes a P-well.

4. The method of claim 1, wherein the isolation layer includes a field oxide.

5. The method of claim 1, wherein the isolation layer includes a shallow trench isolation.

6. The method of claim 1, wherein the floating gate layer includes a polysilicon layer.

7. The method of claim 1, wherein the floating gate layer includes a doped polysilicon layer.

8. The method of claim 1, wherein the tunnel oxide layer includes a patterned tunnel oxide layer.

9. The method of claim 1, wherein the first isolation layer includes a oxide/nitride/oxide layer.

10. The method of claim 1, wherein the control gate layer includes a polysilicon layer.

11. The method of claim 1, wherein the control gate layer includes a doped polysilicon layer.

12. The method of claim 1, wherein the step of patterning the control gate layer, the first isolation layer, and the floating gate layer further includes patterning the tunnel oxide layer.

13. The method of claim 1, wherein the mask layer includes a photoresist layer.

14. The method of claim 1, wherein the source lightly doped region includes an $n^-$-doped layer.

15. The method of claim 1, wherein the source lightly doped region includes an $n^+$-doped layer.

16. The method of claim 1, wherein the drain region includes an $n^+$-doped layer.

17. The method of claim 1, wherein the step of forming the spacers further includes forming the spacers on the liquid phase deposition oxide layer.

18. The method of claim 1, wherein the spacers include oxide layers.

19. The method of claim 1, wherein the spacers include silicon nitride layers.

20. The method of claim 1, wherein the material of silicide layers is one selected from the group consisting of $TiSi_2$ and $CoSi_2$.

* * * * *